United States Patent
Faybisovich et al.

(10) Patent No.: US 8,315,827 B2
(45) Date of Patent: Nov. 20, 2012

(54) FAULT REGION LOCATION SYSTEM

(75) Inventors: Vitaly Faybisovich, West Hollywood, CA (US); Mark I. Khoroshev, South Pasadena, CA (US)

(73) Assignee: Southern California Edison, Rosemead, CA (US)

( * ) Notice: Subject to any disclaimer, the term of this patent is extended or adjusted under 35 U.S.C. 154(b) by 664 days.

(21) Appl. No.: 12/426,871

(22) Filed: Apr. 20, 2009

(65) Prior Publication Data

US 2010/0217548 A1    Aug. 26, 2010

Related U.S. Application Data

(60) Provisional application No. 61/155,845, filed on Feb. 26, 2009.

(51) Int. Cl.
*G01R 31/00* (2006.01)

(52) U.S. Cl. .......................................................... 702/59

(58) Field of Classification Search ...................... 702/59
See application file for complete search history.

(56) References Cited

U.S. PATENT DOCUMENTS

| | | | |
|---|---|---|---|
| 4,719,580 A | 1/1988 | Nimmersjo | |
| 4,766,649 A | 8/1988 | Rudt et al. | |
| 5,903,155 A | 5/1999 | Bjorklund | |
| 6,798,211 B1 | 9/2004 | Rockwell et al. | |
| 6,822,457 B2 * | 11/2004 | Borchert et al. | 324/512 |
| 7,373,282 B2 | 5/2008 | Chen | |
| 7,472,026 B2 | 12/2008 | Premerlani et al. | |
| 2008/0030912 A1 | 2/2008 | Khoroshev | |

OTHER PUBLICATIONS

Gale, P. F., Stokoe, J., Crossley, P.A., "Practical experience with traveling wave fault locators on Scottish Power's 275 & 400 kV transmission system", Sixth International Conference on Developments in Power System Protection, Mar. 25-27, 1997, Conference Publication No. 434, pp. 192-196.

Ban, G., Prikler, L., 'Fault location on EHV lines based on electromagnetic transients', IEEE/NTUA Athens Power Tech Conference "Planning, Operation and Control of Today's Electric Power Systems", Athens, Greece, Sep. 5-8, 1993.

Bewley, L. V. "Traveling Waves on Transmission Systems", The Dover edition, Standard Book No. 486-61104-3, 1963, pp. 6-11.

* cited by examiner

*Primary Examiner* — Stephen Cherry
(74) *Attorney, Agent, or Firm* — Jeffrey G. Sheldon; Sheldon Mak & Anderson

(57) ABSTRACT

A method for identifying an approximate fault location in a power transmission line comprises detecting first and second dominant frequencies in first and second recovering voltages resulting from the fault without using the velocity of either of the recovering voltages.

18 Claims, 4 Drawing Sheets

FAULT REGION LOCATION SYSTEM

CROSS REFENCE TO RELATED APPLICATIONS

This present Application claims priority from U.S. Provisional Patent Application 61/155,845, filed Feb. 26, 2009, entitled "Fault Location Identification System," the contents of which are incorporated herein by reference in their entirety.

BACKGROUND

This invention pertains to locating the region of a power line transmission fault, and more specifically to systems to improve the efficiency and accuracy of locating the region of a power line transmission fault.

A Traveling Wave Fault Location (TWFL) time domain method for locating faults in power transmission lines is described in Gale, P. F., Stoke, J., Crossley, P. A., "Practical experience with traveling wave fault locators on Scottish Power's 275 & 400 kV transmission system", Sixth International Conference on Developments in Power System Protection, 25-27 March 1997, Conference Publication No. 434, pp. 192-196. This method provides automated fault location determination and reporting. Additionally, physical separation of TWFL equipment from relay protection permitted compliance with current security requirements.

Disadvantageously, the TWFL time domain implementation requires highly accurate GPS time stamping of arriving traveling waves at the ends of the transmission line. Also, the performance of the TWFL time domain implementation is negatively affected by waves reflected from system elements adjacent to the faulted line, and by faults outside the monitored line. These problems occur because wave measurements must be performed when circuit breakers at both ends of the faulted power transmission line are still closed.

The prior art also describes a one-ended frequency domain voltage based traveling wave fault location method, where the distance to the fault is determined that the dominant frequency of a recovering voltage at the opened end of transmission line. See Ban, G., Prikler, L, and L., 'Fault location on EHV lines based on electromagnetic transients', IEEE/NTUA Athens Power Tech Conference "Planning, Operation and Control of Today's Electric Power Systems", Athens, Greece, Sep. 5-8, 1993. Advantageously, this method does not require highly accurate GPS time stamping. Disadvantageously, however, simulation and field tests show that the method has limited accuracy. The precision of this one-ended fault location method depends on the accuracy of the value of the speed of wave propagation, v, along the faulted line. The velocity of propagation, v is affected by many factors, such as skin effect and ground resistivity along the power transmission line's corridor.

Therefore, there is a need for a more accurate system for locating the region of a power line transmission fault that does not depend upon the value of the speed of propagation, v.

SUMMARY

A method for identifying an approximate location of a fault in a power transmission line by detecting a fault in the power transmission line is presented. The fault generates a first recovering voltage in a first direction along the power transmission line and a second recovering voltage in a second direction along the power transmission line. Each of the recovering voltages has a dominant frequency. The dominant frequency of the first and the second recovering voltage are determined from a spectrum of frequency information gathered when the fault occurs. Using the dominant frequencies the approximate location of the fault is determined without using the velocity of propagation. Typically, the dominant frequencies and the approximate location of the fault are determined by a specifically programmed industrial computer.

Determining the approximate fault location further comprises transmitting the first and the second dominant frequencies to a processor, which can be located at either terminal unit or at one or more master stations. The length of the power transmission line between the first and second locations, L, is retrieved from storage. The approximate fault location distance is calculated from the first monitoring station by retrieving instructions from a first computer readable medium for dividing the second dominant frequency by the sum of the first dominant frequency and the second dominant frequency and multiplying by L and storing the value calculated in a second computer readable medium.

In another embodiment, there is provided a method for repairing a fault in a power transmission line comprising: a) providing first and a second monitoring stations; b) detecting a fault condition; c) detecting first and a second recovering voltages at the first and the second monitoring stations respectively, the first and second recovering voltages having a respective dominant first and second dominant frequency; d) recording the first and the second recovering voltage frequencies in a computer readable medium at each of the first and the second monitoring stations; e) determining the first and second dominant frequencies of the recovering voltages; f) determining an approximate location of the fault using the dominant frequencies; g) recording in a computer readable medium the approximate fault location; h) outputting the approximate fault location to repair personnel; and i) repairing the fault.

The method is useful on both compensated and non-compensated power transmission lines.

The dominant frequency typically is determined using a spectral analysis, such as, for example, a Fourier transformation.

The step of determining the approximate location of the fault can comprise: a) transmitting the dominant frequencies to a processor; where the processor is located at the first monitoring station, the second monitoring station or at one or more master stations; b) retrieving L from a computer storage medium; c) calculating a fault location distance from the first monitoring station by retrieving instructions from a computer readable medium for dividing the second dominant frequency by the sum of the first dominant frequency and the second dominant frequency and multiplying the results of the division by the L; and d) storing the calculated fault isolation distance in a computer readable medium.

A system for determining the approximate location of the fault can comprise: a) a fault detection device comprising a relay protection circuit; b) an analog-to-digital converter connected to the computer; c) a memory connected to the analog-to-digital converter for recording the first recovering voltage and the second recovering voltage; d) a signal processor connected to the memory for determining the first and second dominant frequencies from the recorded first and second recovering voltages; e) at least one communication port communicatively coupled to the signal processor for transmitting the first and second dominant frequencies; and f) a customized and specifically programmed industrial computer connected to the least one communication port, wherein the computer comprises a computer storage device readable by a machine, tangibly embodying a program of instructions executable by the machine to perform steps for calculating an approximate location of a fault, the instructions comprise dividing the second dominant frequency by the sum of the first dominant frequency and the second dominant frequency and multiplying by a L.

The system also comprises a pre-programmed computer readable storage containing power transmission line lengths between all terminal units.

The system can further comprises: a) a master station communicatively coupled to the at least one communication port; b) computer storage communicatively coupled to the master station for storing power transmission line fault location information for analysis and archiving; and c) an output device communicatively coupled to the master station to transmitting repair instructions.

DRAWINGS

These and other features, aspects and advantages of the present invention will become better understood with regard to the following description, appended claims, and accompanying drawings where:

DETAILED DESCRIPTION

Figure 1:
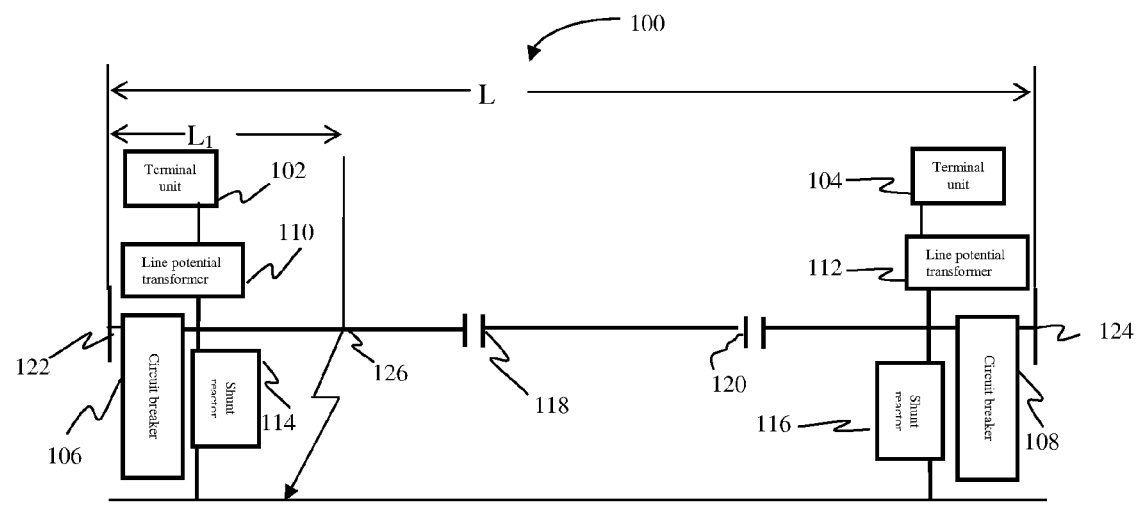
FIG. 1 is a diagram of a faulted power transmission line.

The present invention overcomes limitations of the prior art by substantially improving the accuracy of fault region location by determining recovering voltages at the both ends of a faulted transmission line.

As used in this disclosure, the term "comprise" and variations of the term, such as "comprising", "comprises" and "comprised" are not intended to exclude other components or steps.

The term "region" means a specific area of a power transmission line, where a fault is located, that is less than 10% of the total length of the transmission line, preferably less than 5% of the length of the line, and more preferably between 0.5% and 3% of the transmission line length.

The term "dominant frequency" means a frequency of the most significant harmonic in the frequency range, such as determined by a Fourier transform.

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may be shown in detail.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be rearranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium can represent one or more devices for storing data, including read-only memory (ROM), random access memory (RAM), magnetic disk storage mediums, optical storage mediums, flash memory devices and/or other computer readable mediums for storing information. The term "computer readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or a combination thereof. When implemented in software, firmware, middleware or microcode, the program code or code segments to perform the necessary tasks may be stored in a computer-readable medium such as a storage medium or other storage(s). A processor may perform the necessary tasks. A code segment may represent a procedure, a function, a subprogram, a program, a routine, a subroutine, a module, a software package, a class, or a combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted through a suitable means including memory sharing, message passing, token passing, network transmission, etc.

As can be seen in FIG. 1, a faulted power transmission line 100 is connected to a power utility (not shown) connected through circuit breakers 106 and 108. The power transmission line 100 includes shunt reactors 114 and 116, and series capacitors 118 and 120, placed alongside the power transmission line. The line 100 has a first end 122 and a second end 124.

When a fault 126 develops at a distance $L_1$ from the first end 122 of the line 100, the fault 126 causes the circuit breakers 106 and 108 to open. A transient voltage is detected by a terminal unit 102 at the first end 122 of the faulted power transmission line 100 after circuit breaker 106 opens when a fault occurs. An electromagnetic wave occurs when the circuit breaker 106 opens and travels to the fault 126 and reflects from it. Then, a reflected electromagnetic wave travels to the first end 122 of the line 100, reflects from it, and begins a second journey to the fault location 126. After several such reflections the electromagnetic wave dissipates. A similar process of traveling wave reflections, generated by the opening of circuit breaker 108, exists at the second end 124 of the line 100.

Figure 2:
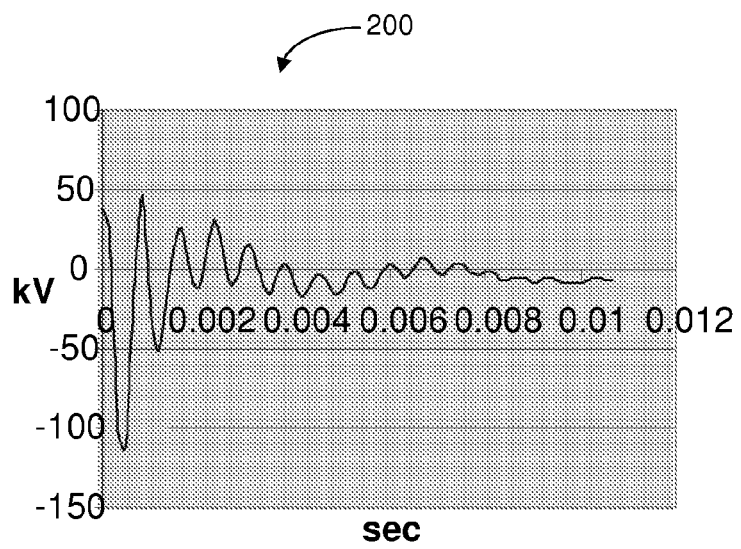
FIG. 2 is a field record of high frequency voltage transients at the opened end of faulted 500 kV line.

For example, as can be seen in FIG. 2, high frequency voltage transients 200 occur at the opened end of a faulted 500 kV line. The dominant high frequency component $f_1$ of a voltage carries information about the distance to the fault 126. With increasing distance to the fault, the time of wave propagation between the end of the line and the fault location escalates, resulting in a reduction of frequency for a voltage oscillation.

Therefore, the following relationship exists between a distance to fault $L_1$ and the dominant frequency $f_1$:

$$L_1 = \frac{v}{4 \times f_1} \quad (1)$$

Where: $f_1$ is the dominant frequency in Hz of the reflected voltage after circuit breaker 106 opens, but before the fault 126 is extinguished; $L_1$ is the distance from circuit breaker 106 to the fault location 126, in miles; and v is a velocity of electromagnetic wave propagation along the power transmission line L, in miles per second. Optionally other units of measurement, such as, for example, kilometers, can be used. The length L of the power transmission line is a known quantity available as a lookup table stored in a memory or manually retrieved from records.

Therefore, it is possible to determine the distance $L_1$ to the fault from equation (1) by identifying the dominant frequency $f_1$ of the voltage transient at the opened end of faulted phase of the power transmission line L immediately after opening of the line and the disappearance of the load current. This method, known as a single-ended frequency domain fault location.

This method, however, is inaccurate as discussed. Using a double-ended frequency domain, herein disclosed, deficiencies of the prior art are overcome and the method of fault location is simplified and more accurate.

Using a double-ended frequency domain approach increases the accuracy of fault location and simplifies the calculations. For example, the dominant frequencies $f_1$ and $f_2$ of the high frequency voltage transients, generated by opening of circuit breakers 106 and 108 at the first and second ends of line 122 and 124, are:

$$f_1 = \frac{v}{4 \times L_1} \quad (2)$$

$$f_2 = \frac{v}{4 \times (L - L_1)} \quad (3)$$

where: L is the known total length of line and $L_1$ and v are as above. Equations (2) and (3) are based on Equation (1).

Assuming there is little variation in the value of v over the range of the dominant frequencies $f_1$ and $f_2$ and excluding v from equations (2) and (3), the distance to fault from the first end 122 of line $L_1$ is:

$$L_1 = L \frac{f_2}{(f_1 + f_2)} \quad (4)$$

This expression does not include the poorly known speed of wave propagation v. Therefore, this double-ended frequency method mitigates the influence of variations in the value of v.

The double ended frequency method has been determined to be more accurate than the prior art single frequency method as demonstrated with the following real world data to check the accuracy of both one-ended and double-ended frequency methods on a 500 kV line. During an insulator hot washing by a maintenance team, a power transmission line phase (C) to ground (G) or CG fault was developed. Data was extracted and analyzed. Because the location of the maintenance team during the hot washing was exactly known, the results from both the single ended and double ended methods can be verified.

Values of the dominant frequencies after circuit breakers opened were:
$f_1$=1360 Hz
$f_2$=193 Hz By using expressions (2), (3) and (4) list above for a known total length of line 237.9 miles and a known fault location at 30.5 mile from the substation the single ended frequency method result was calculated as:

$L_1$=32.3 miles

The calculated double-ended result is:

$L_1$=29.5 miles

A currently used impedance method gave an approximate location for the fault as:

=182.9 miles

As can be seen the double ended method is more accurate calculating the approximate fault location within 0.4% (1 mile error)/(237.9 mile line length). The single ended method was within 0.7% (1.8 miles)/(237.9 mile line length). The currently used method was accurate to 76.9% of the length of the power transmission line.

Figure 3:
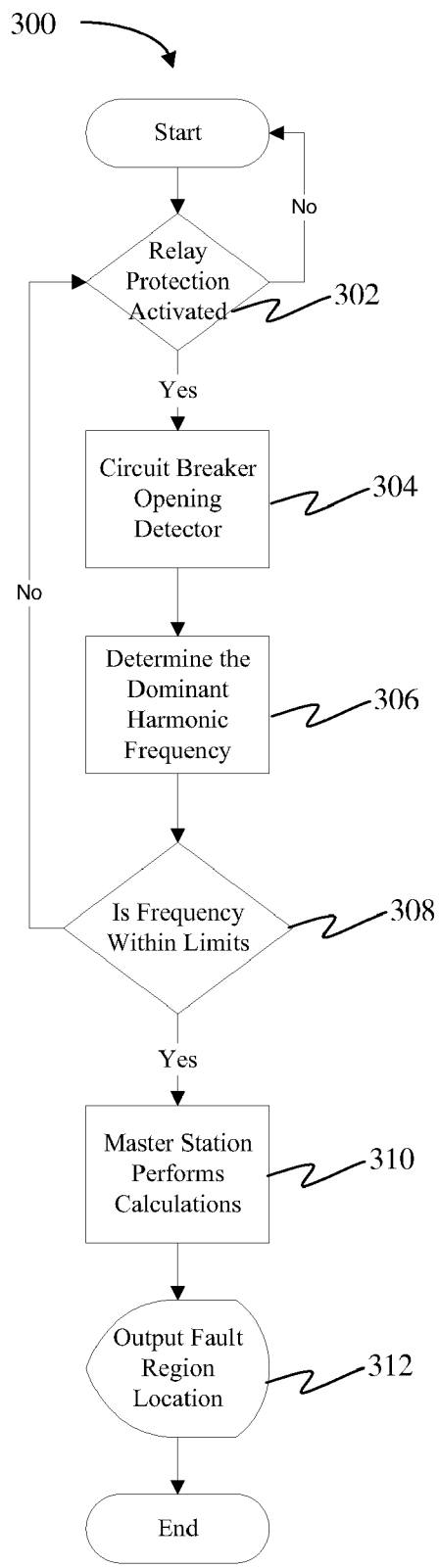
FIG. 3 is a flowchart of some steps of a method for frequency domain fault location according to one embodiment of this invention.

The steps of a method implementing this invention are shown in FIG. 3. Relay protection activation 302 results in a circuit breaker opening 304 due to the relay protection operation 302. Next, the transient recovering voltages at the secondary side of the line potential transformers 110 and 112 are recorded 305 in the memory of terminal unit 102 for a predetermined period of time. Then, the recovering voltages at the faulted phase with the most significant amplitude of high frequency transients are spectrally analyzed 306 to determine the dominant harmonic frequency.

The next step is to determine if a fault has actually occurred, rather than some other event, such as a circuit break intentionally being triggered. A fault is determined to have occurred only if the dominant frequency is between predetermined upper and lower limits. The lower limit is typically set to be slightly less than the frequency of a wave traveling the full length of the line. The upper limit is set by the scanning rate of the analog to digital converter employed in the system 100. The value of the dominant frequency, between the upper and lower limits is recorded in a computer readable medium and can be transferred to one or more master stations 310 together with time of disturbance 308.

Steps 302 thru 308 can be performed by local terminal units 102 and 104 at the both ends of transmission line L rather than at a master station.

If the values of the dominant frequencies from both ends of the line 122 and 124 are within the predetermined limits, one or more master stations 310 calculate the fault location 126 according double-ended frequency domain using equation (4) and record in a computer readable medium the approximate fault location, and then report the approximate fault location as output 312. Then, repair personnel are dispatched to repair the fault.

Optionally, one or both of the terminal units 102 and 104 can comprise the required equipment such as, for example, a memory with power transmission line lengths L, communications devices, and a processor capable of executing instructions from a computer readable medium for dividing the second dominant frequency by the sum of the first dominant frequency and the second dominant frequency, and multiplying the length of the faulted power line segment, to determine the fault region location and transmit the information to the one or more master stations 310 where a report can be output 314.

Figure 4:
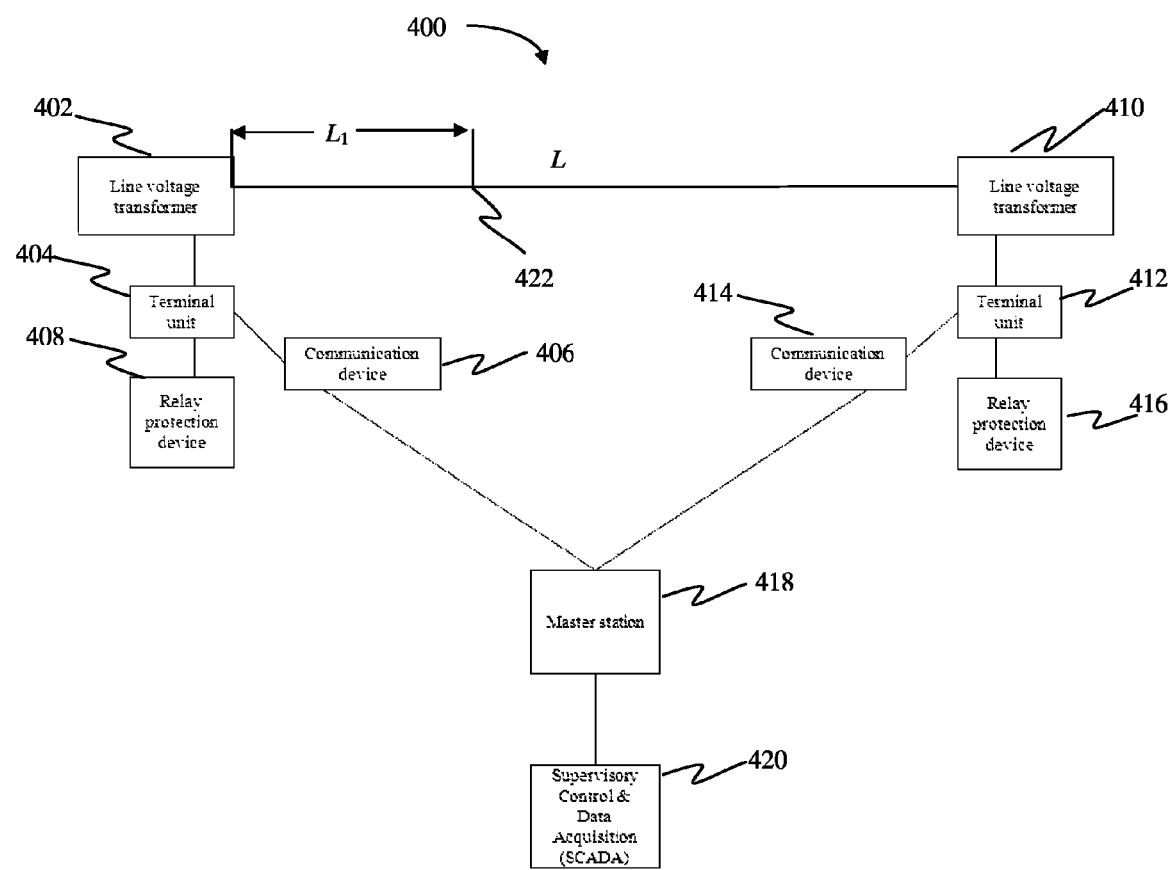
FIG. 4 is a block diagram of a system for double-ended frequency domain fault location according to the present invention.

Referring now to FIG. 4, there is shown a block diagram of a system 400 for double-ended frequency domain fault location. Terminal units 404 and 412 can be connected to line voltage transformers 402 and 410 at both ends 122 and 124, respectively, of the transmission line L. In a preferred embodiment, terminal units 404 and 412 are connected to all phases of the secondary windings of the line voltage transformers 402 and 410. The terminal units 404 and 412 can also be linked to relay protection devices 408 and 416 that can initiate the operation of the system 400. The communication devices 406 and 414 connect terminal units 404 and 412 with one or more master stations 418 that can be linked to a Supervisory Control and Data Acquisition (SCADA) system 420.

For example, when a fault develops at a distance $L_1$ from the line voltage transformer 402 of the power transmission line L at fault location 418, relay protection devices 408 and 416 activate circuit breakers 106 and 108. The existence of a secondary arc at a fault location 422 persists for a period of time after circuit breakers 106 and 108 open, even for temporary faults, such as, for example, a short circuit. The decaying traveling electromagnetic waves reflects between the opened ends of the power transmission line L and the fault location 422.

The traveling electromagnetic waves that are reflected at the both ends of transmission line L for a period of time following the start of the fault 422 are recorded in memories of terminal units 404 and 412. Signal processors embedded in the terminal units 404 and 412 perform spectral analysis of the recorded voltages to detect the dominant frequencies $f_1$ and $f_2$. The frequencies $f_1$ and $f_2$ are checked against predetermined upper and low limits. The upper limit is determined by the sampling rate of the analog-to-digital converter and the lower limit is determined by the power frequency and length of the line L. The spectral analysis can be any form of currently available spectral analysis. In a preferred embodiment, the spectral analysis is a Fourier transform.

After the dominant frequencies $f_1$ and $f_2$ have been determined, each terminal unit 404 and 412 can transfer the information to one or more master stations 418. The information can include the value of the dominant frequencies, the results of validation for limits violation, and the time of the relay protection operation. Receiving this information from both ends 402 and 410 of the power transmission line L and matching concurrent disturbances the one or more master stations 418 will calculate the distance to fault $L_1$ by using expression (4), where the length of the power transmission line L is a known value that is retrieved from a memory.

Figure 5:
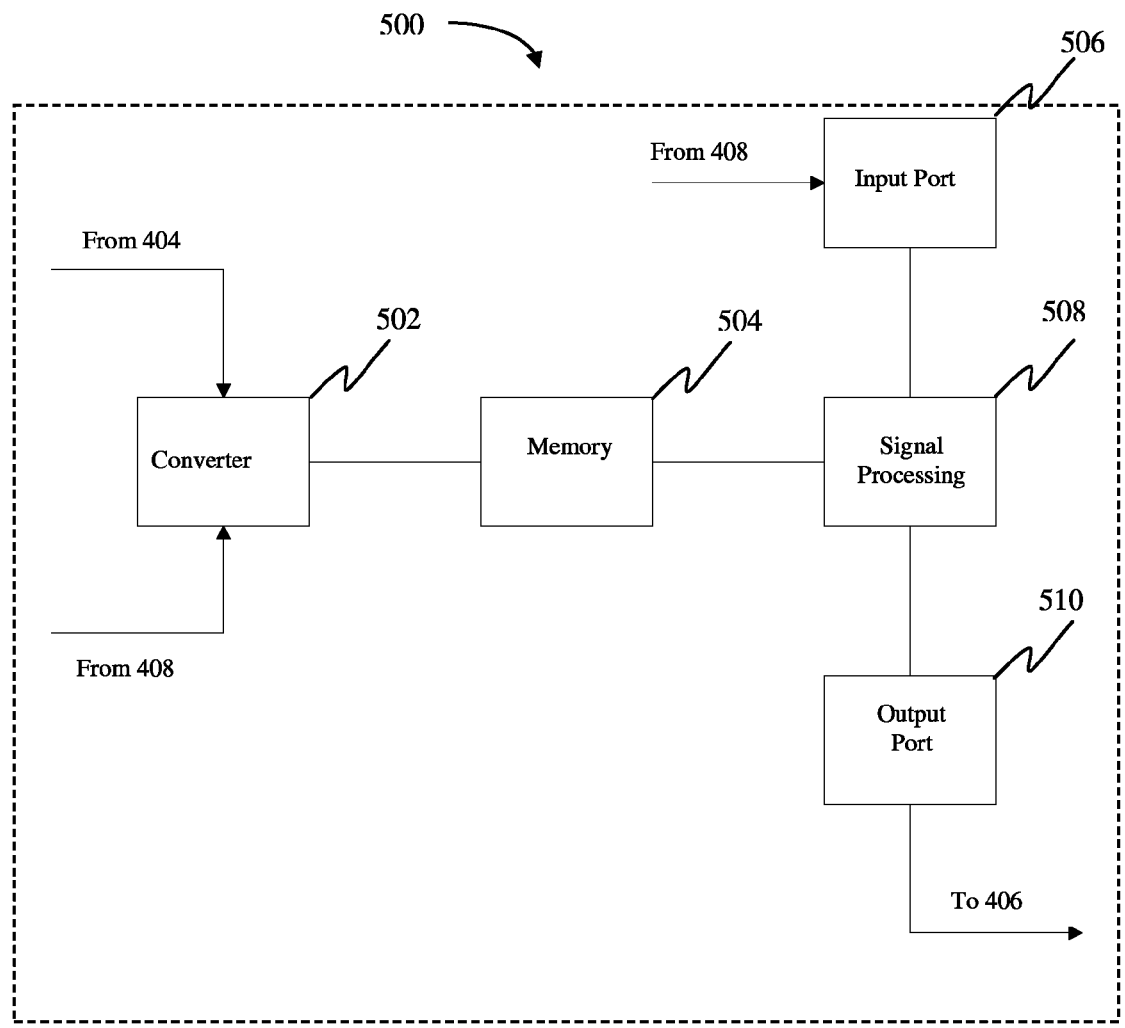
FIG. 5 is a block diagram of a terminal unit useful for frequency domain double-ended fault location of the present invention.

Referring now to FIG. 5, there is shown a block diagram of terminal unit 404. Terminal unit 412 can have the same configuration. The terminal unit 404 preferably is a customized and specifically programmed industrial computer that includes analog-to-digital converter 502, connected to memory 504, which is connected with a signal processor 508. The signal processor 508 is connected with input 506 and output 510 communication ports.

After receiving an initiating signal from protection device 408, the analog-to-digital converter 502 scans a recovering voltage. The analog-to-digital converter 502 operation creates digitized data. The digitized data is transferred to the memory 504. Then the signal processor 508 spectrally analyzes the digitized data in memory 504 to determine the dominant frequency. The dominant frequency is checked against the lower limit and the upper limit. In one embodiment, if both the upper and the lower limits are satisfied, a time stamped value of the dominant frequency is transmitted to the one or more master stations 418 through the communication device 510 for further processing.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A method for identifying an approximate location of a fault in a power transmission line, the method comprising the steps of:
    a) detecting a fault in the power transmission line, the fault generating a first recovering voltage in a first direction along the power transmission line and a second recovering voltage in a second direction along the power transmission line, the first recovering voltage having a first dominant frequency and the second recovering voltage having a second dominant frequency;
    b) determining the dominant frequency of the first recovering voltage and the dominant frequency of the second recovering voltage in a specifically programmed industrial computer; and
    c) determining the approximate location of the fault using the first and the second dominant frequencies.

2. The method of claim 1, wherein the step of determining the approximate location of the fault is performed in a specifically programmed industrial computer.

3. The method of claim 1, wherein the step of determining the dominant frequencies comprises determining a spectrum of frequencies of the first recovering voltage at a first location and a spectrum of frequencies of the second recovering voltage at a second location, the first and second locations being spaced apart from each other and the location of the fault.

4. The method of claim 3, wherein the approximate fault location is determined without using a velocity of propagation of either recovering voltage.

5. The method of claim 3, wherein the step of determining the approximate fault region comprises determining the distance between the first location and the approximate fault location $L_1$, wherein:

$$L_1 = L \frac{f_2}{(f_1 + f_2)}$$

where:
    L is the length of the power transmission line between the first and second locations;
    $f_1$ is the dominant frequency of the first recovering voltage at the first location; and
    $f_2$ is the dominant frequency of the second recovering voltage at the second location.

6. The method of claim 3, wherein the step of determining the approximate fault location further comprises the steps of:
    a) transmitting the first and the second dominant frequencies to a processor,
        wherein the processor is located at the first location, the second location, or one or more master stations;
    b) retrieving a length, L, for the power transmission line between the first and second locations from a computer storage medium;
    c) calculating a fault location distance from the first monitoring station by retrieving instructions from a first computer readable medium for dividing the second dominant frequency by the sum of the first dominant frequency and the second dominant frequency and multiplying by the length of the power transmission line segment; and d) storing the value calculated in step c) in a second computer readable medium which is the same or different than the first computer readable medium.

7. A method for identifying an approximate location of a fault in a power transmission line, the method comprising the steps of:
   a) providing a first and a second monitoring station;
   b) detecting a fault condition;
   c) detecting the first and the second recovering voltages at the first and the second monitoring stations respectively;
   d) recording the first and the second recovering voltage frequencies in a computer readable medium at each of the first and the second monitoring stations;
   e) determining the dominant voltage frequency of the first recovering voltage frequency at the first monitoring station and the second dominant frequency of the second recovering voltage at the second monitoring station;
   f) determining the approximate location of the fault in a power transmission line using the dominant frequencies;
   g) recording in a computer readable medium the approximate fault location;
   h) outputting the approximate fault location to repair personnel; and
   i) repairing the fault.

8. The method of claim 7, wherein the power transmission line is a non-compensated power transmission line.

9. The method of claim 7, wherein the power transmission line is a compensated power transmission line.

10. The method of claim 7, wherein the dominant frequency is determined using a spectral analysis.

11. The method of claim 10, wherein the spectral analysis is a Fourier transformation.

12. The method of claim 7, wherein the step of determining the approximate location of the fault comprises the steps of:
   a) transmitting the dominant frequencies to a processor; wherein the processor is located at the first monitoring station, the second monitoring station or at one or more master stations;
   b) retrieving a length for the power transmission line segment between the first and second monitoring stations from a computer storage medium;
   c) calculating a fault location distance from the first monitoring station by retrieving instructions from a computer readable medium for dividing the second dominant frequency by the sum of the first dominant frequency and the second dominant frequency and multiplying the results of the division by the length of the power transmission line segment; and
   d) storing the calculated fault isolation distance in a computer readable medium.

13. The method of claim 7, wherein the step of determining the approximate location of the fault further comprises the steps of:
   a) transmitting the first and the second frequencies to one or more master stations;
   b) retrieving a length for a power transmission line segment between the first and second monitoring system from a computer storage medium located at the one or more master stations;
   c) calculating a fault location distance from the first monitoring station by executing instructions from a device for dividing the second dominant frequency by the sum of the first dominant frequency and the second dominant frequency and multiplying results of the division by the length of the power transmission line segment; and
   d) storing the calculated value in a computer readable medium at the one or more master stations.

14. A method for identifying an approximate location of a fault in a power transmission line, the method comprising the steps of:
   a) detecting a fault in the power transmission line, the fault generating a first recovering voltage in a first direction along the power transmission line and a second recovering voltage in a second direction along the power transmission line, the first recovering voltage having a first dominant frequency and the second recovering voltage having a second dominant frequency;
   b) determining the dominant frequency of the first recovering voltage and the dominant frequency of the second recovering voltage in a specifically programmed industrial computer; and
   c) determining the approximate location of the fault using the first and the second dominant frequencies;
   d) providing a first and a second monitoring station;
   e) retrieving a length for a power transmission line segment between the first and second monitoring stations from a computer storage medium;
   f) calculating a fault location distance from the first monitoring station by executing instructions from a device for dividing the second dominant frequency by the sum of the first dominant frequency and the second dominant frequency and multiplying results of the division by the length of the power transmission line segment; and
   g) storing the calculated fault location distance in a computer readable medium;
   h) outputting the approximate fault location to repair personnel; and
   i) repairing the fault.

15. A system for determining the approximate location of a fault along a power transmission line, the system comprising:
   a) a fault detection device comprising a relay protection circuit;
   b) an analog-to-digital converter connected to the computer;
   c) a memory connected to the analog-to-digital converter for recording a first recovering voltage at a first location and a second recovering voltage at a second location;
   d) a signal processor connected to the memory for determining a first dominant frequency and a second dominant frequency from the recorded first and second recovering voltages respectively;
   e) at least one communication port communicatively coupled to the signal processor for transmitting the first and second dominant frequencies; and
   f) a customized and specifically programmed industrial computer connected to the communication port, wherein the computer comprises a computer storage device readable by a machine, tangibly embodying a program of instructions executable by the machine to perform steps for calculating an approximate location of a fault, the instructions comprise dividing the second dominant frequency by the sum of the first dominant frequency and the second dominant frequency and multiplying by a length of the power transmission line between the first and second locations.

16. The system of claim 15 further comprising:
   a) a master station communicatively coupled to the at least one communication port;

b) computer storage communicatively coupled to the master station for storing power transmission line fault location information for analysis and archiving; and
c) an output device communicatively coupled to the master station for transmitting repair instructions.

17. A system for identifying the approximate location of a fault in a power transmission line comprising the steps of:
   a) means for detecting a fault condition, the fault generating a first recovering voltage in a first direction in the power transmission line and a second recovering voltage in a second direction in the power transmission line;
   b) means for determining the dominant frequency of the first recovering voltage at a first location and the dominant frequency of the second recovering voltage at a second location, the first and second locations being apart from each other and the fault; and
   c) means for determining the approximate fault location using the first and the second dominant frequencies, wherein the approximate fault location is determined without using the velocity of either recovering voltage.

18. A method for identifying an approximate location of a fault in a power transmission line, the method comprising the steps of:
   a) detecting a fault, the fault generating a first recovering voltage in a first direction along the power transmission line and a second recovering voltage in a second direction along the power transmission line, each recovering voltage having a dominant frequency;
   b) determining the dominant frequency of the first recovering voltage and the dominant frequency of the second recovering voltage in a specifically programmed industrial computer,
   wherein determining the dominant frequencies comprises determining a spectrum of frequencies of the first recovering voltage at a first location and a spectrum of frequencies of the second recovering voltage at a second location, the first and second locations being spaced apart from each other and the fault; and
   c) determining the approximate location of the fault using the first and the second dominant frequencies,
   wherein determining the approximate fault region comprises determining the distance between the first location and the approximate fault location, $L_1$, wherein:

$$L_1 = L\frac{f_2}{(f_1 + f_2)}$$

where:
   L is the length of the power transmission line between the first and second locations;
   $f_1$ is the dominant frequency of the first recovering voltage at the first location; and
   $f_2$ is the dominant frequency of the second recovering voltage at the second location;
   wherein the approximate fault location is determined without using a velocity of either recovering voltage traveling wave.

* * * * *